US012533714B2

(12) United States Patent
Choi et al.

(10) Patent No.: US 12,533,714 B2
(45) Date of Patent: Jan. 27, 2026

(54) UNIT FOR SUPPLYING LIQUID, APPARATUS AND METHOD FOR TREATING SUBSTRATE WITH THE UNIT

(71) Applicant: SEMES CO., LTD., Cheonan-si (KR)

(72) Inventors: Gi Hun Choi, Changwon-si (KR); Young Joon Han, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 616 days.

(21) Appl. No.: 17/946,153

(22) Filed: Sep. 16, 2022

(65) Prior Publication Data
US 2023/0100773 A1    Mar. 30, 2023

(30) Foreign Application Priority Data

Sep. 17, 2021 (KR) .................. 10-2021-0124479

(51) Int. Cl.
*B08B 3/02* (2006.01)
*B08B 13/00* (2006.01)
*H01L 21/67* (2006.01)
*H01L 21/677* (2006.01)

(52) U.S. Cl.
CPC .............. *B08B 3/022* (2013.01); *B08B 3/02* (2013.01); *B08B 13/00* (2013.01); *H01L 21/67051* (2013.01); *H01L 21/67196* (2013.01); *H01L 21/67742* (2013.01); *H01L 21/67766* (2013.01); *B08B 2203/007* (2013.01)

(58) Field of Classification Search
None
See application file for complete search history.

(56) References Cited

U.S. PATENT DOCUMENTS

2017/0028413 A1* 2/2017 Oh ..................... B05B 7/10

FOREIGN PATENT DOCUMENTS

| JP | H10-144648 A | 5/1998 |
| JP | H10-156255 A | 6/1998 |
| JP | H11-111603 A | 4/1999 |

(Continued)

OTHER PUBLICATIONS

Office Action, dated May 31, 2023, issued in corresponding Korean Patent Application No. 10-2021-0124479.

(Continued)

*Primary Examiner* — Levon J Shahinian
(74) *Attorney, Agent, or Firm* — Harness, Dickey & Pierce, P.L.C.

(57) ABSTRACT

The substrate treating apparatus includes a liquid supply unit for supplying a treating liquid to a substrate supported by a support unit, the liquid supply unit includes a nozzle member for discharging the treating liquid; and a driving member for moving the nozzle member to a standby position and a process position, the nozzle member includes a body having a buffer space and a discharge port configured to discharge the treating liquid; and a rotation member for changing the body between a first state and a second state by a rotation, the first state is a state at which a treating liquid filled in the buffer space is maintained so the treating liquid does not flow to the discharge port, and the second state is a state at which the treating liquid filled in the buffer space is discharged to an outside of the body through the discharge port.

16 Claims, 6 Drawing Sheets

(56) References Cited

FOREIGN PATENT DOCUMENTS

| | | | |
|---|---|---|---|
| JP | 2010-253439 A | 11/2010 |
| KR | 101055606 B1 | 8/2011 |
| KR | 102117353 B1 | 6/2020 |

OTHER PUBLICATIONS

Office Action for Korean Application No. 10-2021-0124479 dated Feb. 23, 2024.

\* cited by examiner

UNIT FOR SUPPLYING LIQUID, APPARATUS AND METHOD FOR TREATING SUBSTRATE WITH THE UNIT

CROSS-REFERENCE TO RELATED APPLICATIONS

A claim for priority under 35 U.S.C. § 119 is made to Korean Patent Application No. 10-2021-0124479 filed on Sep. 17, 2021, in the Korean Intellectual Property Office, the entire contents of which are hereby incorporated by reference.

BACKGROUND

Embodiments of the inventive concept described herein relate to a liquid supply unit and a substrate treating apparatus and method having the same, more specifically, a substrate treating apparatus and method for treating a substrate by supplying a liquid, and a liquid supply unit used therein.

In a semiconductor manufacturing process, various processes such as a photolithography process, an etching process, an ashing process, a thin film deposition process, and a cleaning process are performed. The cleaning process for removing various contaminants generated while performing each process is performed before or after each process. In general, in the cleaning process, contaminants remaining on the substrate are removed by using a chemical (solution) such as a chemical or a rinsing liquid on the substrate.

In the cleaning process using the chemical, a chemical heated to a preset temperature or higher is used. In an embodiment, if a chemical such as a phosphoric acid ($P_2O_5$) is used, a chemical heated to 200° C. or higher is required. An apparatus for supplying a liquid onto the substrate is provided with resin components such as a filter. In addition, a configuration of a liquid supply apparatus which may include a pump and a valve has a limitation in a heat-resistant performance. Accordingly, if the chemical is heated in the liquid supply apparatus and supplied onto the substrate, a heated chemical flows inside resin components such as a filter, a pump having a weak heat resistance, and a valve provided in the liquid supply device, causing damage.

In addition, a support unit supporting the substrate may be heated to indirectly heat a bottom portion of the substrate to heat the chemical supplied onto the substrate. However, this method is an indirect method in which the chemical is not discharged onto the substrate in a high-temperature state, and the chemical is discharged onto the substrate and then heated, thereby degrading a process performance. In addition, this method has a problem in that an amount of the chemical supplied onto the substrate increases.

SUMMARY

Embodiments of the inventive concept provide a liquid supply unit for efficiently supplying a treating liquid onto a substrate, and a substrate treating apparatus and a substrate treating method having the same.

Embodiments of the inventive concept provide a liquid supply unit for increasing a temperature of a treating liquid to a target temperature and supplying the treating liquid on a substrate, and a substrate treating apparatus and a substrate treating method having the same.

Embodiments of the inventive concept provide a liquid supply unit for efficiently controlling a temperature of a treating liquid, and a substrate treating apparatus and a substrate treating method having the same.

Embodiments of the inventive concept provide a liquid supply unit for efficiently removing a vapor pressure generated at a process of increasing a temperature of a treating liquid to a target temperature, and a substrate treating apparatus and a substrate treating method having the same.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a treating container having a treating space; a support unit configured to support a substrate at the treating space; and a liquid supply unit for supplying a treating liquid to a substrate supported by the support unit, and wherein the liquid supply unit includes: a nozzle member for discharging the treating liquid; and a driving member for moving the nozzle member to a standby position and a process position, and wherein the nozzle member includes: a body having a buffer space therein and a discharge port configured to discharge the treating liquid; and a rotation member for changing the body between a first state and a second state by a rotation, and wherein the first state is a state at which a treating liquid filled in the buffer space is maintained so the treating liquid does not flow to the discharge port, and the second state is a state at which the treating liquid filled in the buffer space is discharged to an outside of the body through the discharge port.

In an embodiment, a bottom surface of the buffer space includes an inclined portion which is downwardly inclined toward the ground in a direction away from the discharge port.

In an embodiment, the bottom surface of the buffer space further comprises a horizontal portion which extends in a horizontal direction with respect to the ground from a top end of the inclined portion.

In an embodiment, the nozzle member further includes: a heating member configured to heat the treating liquid filled in the buffer space; and an exhaust member for exhausting an atmosphere of the buffer space.

In an embodiment, the liquid supply unit includes: a supply pipe for supplying the treating liquid to the buffer space; and a supply valve for opening and closing the supply pipe.

In an embodiment, the body is provided in a material having a stronger heat resistance than the supply valve.

In an embodiment, the substrate treating apparatus further includes a controller for controlling the liquid supply unit, and wherein the controller controls the rotation member to rotate the body so an inclination of the body changes between the first state and the second state.

In an embodiment, the bottom surface of the buffer space is provided inclined from the ground in the first state.

In an embodiment, the bottom surface of the buffer space is provided less inclined than an inclination of the first state or parallel to the ground in the second state.

In an embodiment, the treating liquid filled in the buffer space is provided as a single discharge amount onto the substrate supported by the support unit.

The inventive concept provides a liquid supply unit for supplying a treating liquid onto a substrate. The liquid supply unit includes a nozzle member for discharging the treating liquid; and a driving member for moving the nozzle member to a standby position and a process position, and wherein the nozzle member includes: a body having a buffer space therein and a discharge port configured to discharge the treating liquid; and a rotation member for changing the body between a first state and a second state by a rotation, and wherein the first state is a state at which a treating liquid filled in the buffer space is maintained so the treating liquid does not flow from the discharge port, and the second state is a state at which the treating liquid filled in the buffer space is discharged to an outside of the body though the discharge port.

In an embodiment, a bottom surface of the buffer space includes an inclined portion which is downwardly inclined toward the ground in a direction away from the discharge port; and a horizontal portion which extends in a horizontal direction with respect to the ground from a top end of the inclined portion, and wherein the discharge port is provided at the horizontal portion.

In an embodiment, the nozzle member further includes a heating member configured to heat the treating liquid filled in the buffer space; and an exhaust member for exhausting an atmosphere of the buffer space.

In an embodiment, the liquid supply unit further includes a supply pipe for supplying the treating liquid to the buffer space; and a supply valve for opening and closing the supply pipe.

In an embodiment, the body is provided in a material having a stronger heat resistance than the supply valve.

In an embodiment, the bottom surface of the buffer space is provided inclined toward the ground in the first state, and the bottom surface of the buffer space is provided less inclined than an inclination of the first state or parallel to the ground in the second state.

The inventive concept provides a substrate treating method. The substrate treating method includes supplying a treating liquid to a buffer space within a body and have the treating liquid in the buffer space stand-by in a state of a body of a nozzle member positioned in a first state, changing a position of the body to a second state, and discharging the treating liquid in the buffer space through a discharge port provided at the body, and wherein the first state is a state at which a treating liquid filled in the buffer space is maintained so the treating liquid does not flow to the discharge port, and the second state is a state at which the treating liquid filled in the buffer space is discharged to an outside of the body through the discharge port.

In an embodiment, the nozzle member is positioned at a standby position before the substrate is loaded on a support unit, and moves from the standby position to a process position if the support unit is loaded on the substrate, and at the standby position the treating liquid is supplied to the buffer space.

In an embodiment, an amount of the treating liquid supplied to the buffer space is a single discharge amount onto the substrate.

According to an embodiment of the inventive concept, a treating liquid may be efficiently supplied onto a substrate.

According to an embodiment of the inventive concept, a temperature of a treating liquid may be increased to a target temperature and the treating liquid may be supplied onto a substrate.

According to an embodiment of the inventive concept, a temperature of a treating liquid may be efficiently controlled.

According to an embodiment of the inventive concept, a vapor pressure generated during a process of increasing a temperature of a treating liquid to a target temperature may be efficiently removed.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
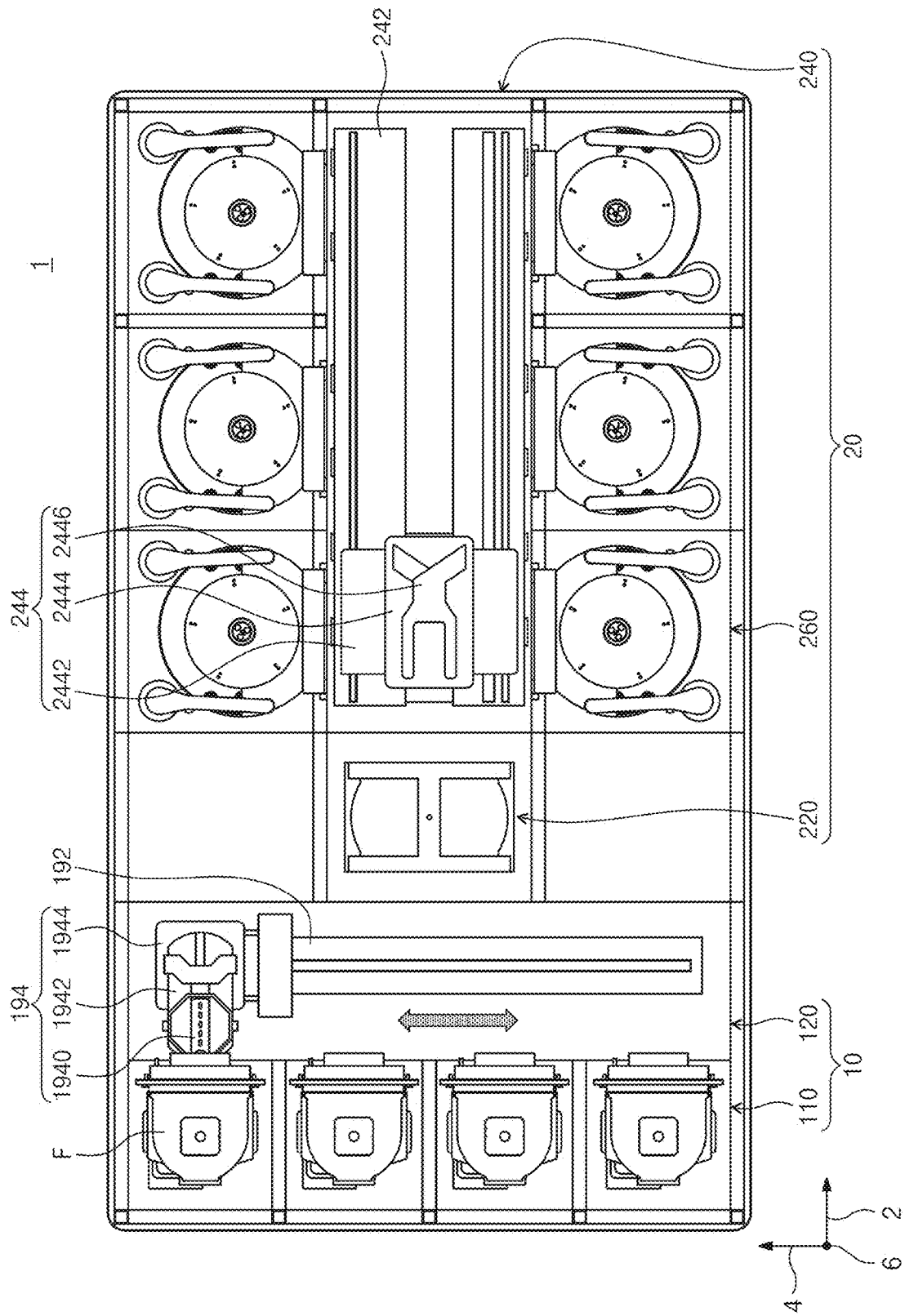
FIG. 1 schematically illustrates an embodiment of a substrate treating apparatus of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. The embodiment is provided to more fully explain the inventive concept to a person with average knowledge in the art. Therefore, the form of the components in the drawings is exaggerated to emphasize a clearer description.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

In the embodiment, a process of liquid treating a substrate by supplying a liquid such as a cleaning liquid onto the substrate will be described as an example. However, the embodiment is not limited to a cleaning process, and may be applied to various processes for treating the substrate using a treating liquid such as an etching process, an ashing process, a developing process, and the like. Hereinafter, an embodiment of the inventive concept will be described in detail with reference to FIG. 1 to FIG. 8.

FIG. 1 schematically illustrates an embodiment of a substrate treating apparatus. Referring to FIG. 1, the substrate treating apparatus 1 includes an index module 10 and a treating module 20. According to an embodiment, the index module 10 and the treating module 20 are disposed in a direction. Hereinafter, a direction in which the index module 10 and the treating module 20 are disposed is referred to as a first direction 2, a direction perpendicular to the first direction 2 when seen from above is referred to as a second direction 4, and a direction perpendicular to a plane including both the first direction 2 and the second direction 4 is defined as a third direction 6.

The index module 10 transfers the substrate W from a container 100 in which the substrate W is stored to the treating module 20 that treats the substrate W. The index module 10 receives the substrate W that has been treated at the treating module 20 and stores the substrate W at the container F. A lengthwise direction of the index module 10 is provided in the second direction 4. The index module 10 has a load port 110 and an index frame 120.

The container F in which the substrate W is stored is mounted on the load port 110. The load port 110 are disposed on two opposite sides of the index frame 120. The load port 110 may be provided in a plurality, and the plurality of load ports 110 may be arranged in a direction along the second direction 4. A number of load ports 110 may increase or decrease according to a process efficiency and a foot print condition of the treating module 20.

A plurality of slots (not shown) are formed at the container F to store the substrates W in a state in which the substrates W are horizontally arranged with respect to the ground. As the container F, a sealed container such as a front opening unified pod (FOUP) may be used. The container F may be placed on the load port 110 by a transfer means (not shown) such as an overhead transfer, an overhead conveyor, or an automatic guided vehicle, or by an operator. An index rail 192 and an index robot 194 are provided within the index frame 120.

The index rail 192 is provided with its lengthwise direction along the second direction 4 within the index frame 120. The index robot 194 may transfer the substrate W. The index robot 194 may transfer the substrate W between the index module 10 and the buffer unit 220.

The index robot 194 may include an index hand 1940. The substrate W may be placed on the index hand 1940. The index hand 1940 may include an index base 1942 having an annular ring form in which a part of the circumference is symmetrically cut-out, and an index support unit 1944 for moving the index base 1942. A configuration of the index hand 1940 is the same as or similar to a configuration of a transfer hand to be described later. The index hand 1940 may be provided to be movable along the second direction 4 along the index rail 192. Accordingly, the index hand 1940 may forwardly and backwardly move along the index rail 192. In addition, the index hand 1940 may be provided to be rotatable with the third direction 6 as an axis, and movable along the third direction 6.

A controller 30 may control the substrate treating apparatus. The controller 30 may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The controller 30 may control the substrate treating apparatus 1 so it may perform a substrate treating method to be explained below. For example, the controller 30 may control components provide to a process chamber 260 so the substrate treating method to be explained below may be performed.

The treating module 20 includes a buffer unit 220, a transfer chamber 240, and a process chamber 260. The buffer unit 220 provides a space in which a substrate W taken into the treating module 20 and a substrate W taken out from the treating module 20 temporarily remain. The transfer chamber 240 provides a space for transferring the substrate W between the buffer unit 220 and the process chamber 260 and between the process chambers 260. The process chamber 260 may perform a liquid treating process of treating the substrate W by supplying a liquid onto the substrate W. For example, the liquid treating process may be a cleaning process of cleaning the substrate with a cleaning liquid. A chemical treatment, a rinsing treatment, and a drying treatment may all be performed on the substrate within the process chamber. Optionally, a process chamber for drying the substrate may be provided separately from a process chamber for performing a liquid treatment.

The buffer unit 220 may be disposed between the index frame 120 and the transfer chamber 240. The buffer unit 220 may be positioned at an end of the transfer chamber 240. A slot (not shown) on which the substrate W is placed is provided inside the buffer unit 220. A plurality of slots (not shown) are provided to be spaced apart from each other along the third direction 6. A front face and a rear face of the buffer unit 220 are opened. The front face is a surface facing the index module 10, and the rear face is a surface facing the transfer chamber 240. The index robot 194 may access the buffer unit 220 through the front face, and the transfer robot 244, which will be described later, may access the buffer unit 220 through the rear face.

A lengthwise direction of the transfer chamber 240 may be provided in the first direction 2. Each of the process chambers 260 may be disposed on both sides of the transfer chamber 240. The process chamber 260 may be disposed at a side of the transfer chamber 240. The process chamber 260 and the transfer chamber 240 may be disposed along the second direction 4. According to an embodiment, the process chambers 260 may be disposed on both sides of the transfer chamber 240, and the process chambers 260 may be provided in an arrangement of A×B (A and B are natural numbers greater than 1 or 1) along the first direction 2 and the third direction 6, respectively. Here, A is a number of process chambers 260 provided in a row along the first direction 2, and B is the number of process chambers 260 provided in a row along the third direction 6. When four or six process chambers 260 are provided at a side of the transfer chamber 240, the process chambers 260 may be arranged in an arrangement of 2×2 or 3×2. A number of the process chambers 260 may increase or decrease. Unlike the above, the process chamber 260 may be provided only at a side of the transfer chamber 240. In addition, the process chamber 260 may be provided as a single layer at a side and at both sides of the transfer chamber 240.

The transfer chamber 240 includes a guide rail 242 and a transfer robot 244. The guide rail 242 is provided with its lengthwise direction in the first direction 2 within the transfer chamber 240. The transfer robot 244 may be provided to be linearly movable along the first direction 2 on the guide rail 242. The transfer robot 244 transfers the substrate W between the buffer unit 220 and the process chamber 260 and between the process chambers 260.

The transfer robot 2440 includes a base 2442, a body 2444, and an arm 2446. The base 2442 is installed to be movable in the first direction 2 along the guide rail 242. The body 2444 is coupled to the base 2442. The body 2444 is provided to be movable along the third direction 6 on the base 2442. In addition, the body 2444 is provided to be rotatable on the base 2442. The arm 2446 is coupled to the body 2444, which is provided to be forwardly and backwardly movable with respect to the body 2444. The arm 2446 is provided in a plurality to be driven individually, respectively. The arms 2446 are disposed to be stacked on each other and spaced apart from each other along the third direction 6.

The process chamber 260 performs a liquid treating process on the substrate W. For example, the process chamber 260 may be a chamber that performs a cleaning process by supplying the cleaning liquid to the substrate W. Unlike this, the process chamber 260 may be a chamber that performs a wet etching process of removing a thin film on the substrate by supplying a liquid plasma. The process chamber 260 may have a different structure depending on a type of a process for treating the substrate W. Alternatively, each of the process chambers 260 may have a same structure. Selectively, the process chambers 260 may be divided into a plurality of groups, and the process chambers 260 belonging to one of the groups may be process chambers 260 performing any one of the cleaning process and the wet etching process, and process chambers 260 belong to another one of the groups may be process chambers 260 performing any one of the cleaning process and the wet etching process.

In the following embodiment of the inventive concept, a case where the liquid treating process of treating the substrate W by supplying a liquid onto the substrate W from the process chamber 260 will be described as an example.

Figure 2:
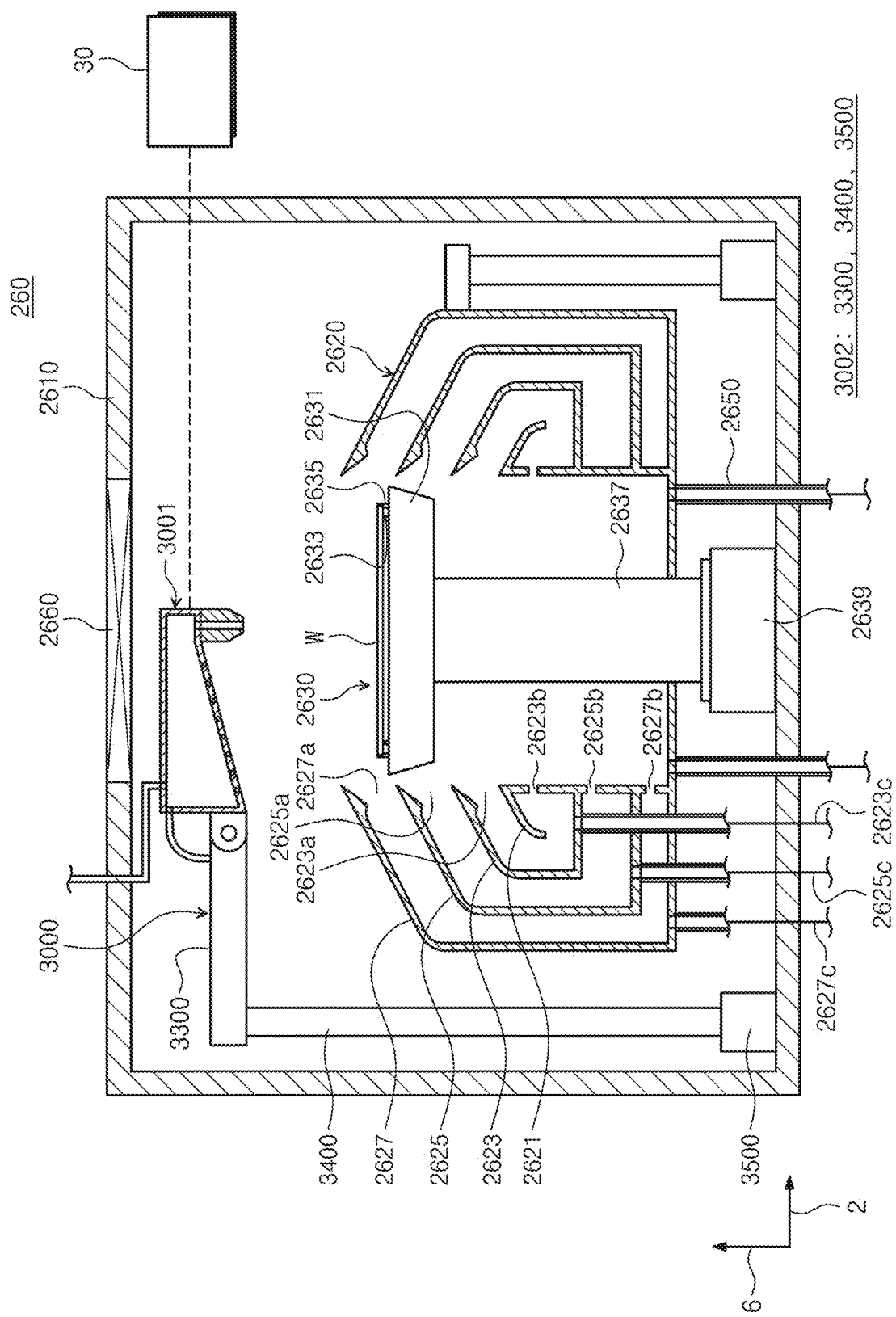
FIG. 2 schematically illustrates a process chamber of FIG. 1.

FIG. 2 schematically illustrates an embodiment of a process chamber of FIG. 1. Referring to FIG. 2, the process chamber 260 includes a housing 2610, a treating container 2620, a support unit 2630, and a liquid supply unit 3000.

The housing 2610 has a space therein. The housing 2610 has generally a rectangular parallelepiped form. The treating container 2620, the support unit 2630, and the liquid supply unit 3000 are disposed within the housing 2610.

The treating container 2620 has a treating space with an open top. The substrate W is liquid-treated within the treating space. The support unit 2630 supports the substrate W in the treating space and rotates the substrate W. The liquid supply unit 3000 supplies a liquid onto the substrate W supported by the support unit 2630. The liquid may be provided in a plurality of types and may be sequentially supplied onto the substrate W.

According to an embodiment, the treating container 2620 has a guide wall 2621 and a plurality of recollecting containers 2623, 2625, and 2627. Each of the recollecting containers 2623, 2625, and 2627 separates and recollects different liquids from the liquids used for the substrate treatment. Each of the recollecting containers 2623, 2625, and 2627 has a recollecting space for recollecting the liquid used for the substrate treatment. The guide wall 2621 and each of the recollecting containers 2623, 2625, and 2627 are provided in an annular ring form surrounding the support unit 2630. When the liquid treating process is performed, a liquid scattered by the rotation of the substrate W is introduced into the recollecting space through inlets 2623*a*, 2625*a*, and 2627*a* to be described later of the recollecting containers 2623, 2625, and 2627 respectively. Different types of the treating liquid may flow into each recollecting container.

According to an embodiment, the treating container 2620 has the guide wall 2621, the first recollecting container 2623, the second recollecting container 2625 and the third recollecting container 2627. The guide wall 2621 is provided in an annular ring form surrounding the support unit 2630, and the first recollecting container 2623 is provided in an annular ring form surrounding the guide wall 2621. The second recollecting container 2625 is provided in an annular ring form surrounding the first recollecting container 2623, and the third recollecting container 2627 is provided in an annular ring form surrounding the second recollecting container 2625. A space between the first recollecting container 2623 and the guide wall 2621 functions as a first inlet 2623*a* through which a liquid is introduced. A space between the first recollecting container 2623 and the second recollecting container 2625 functions as a second inlet 2625*a* through which a liquid is introduced. A space between the second recollecting container 2625 and the third recollecting container 2627 functions as a third inlet 2627*a* through which a liquid is introduced. The second inlet 2625*a* is positioned above the first inlet 2623*a*, and the third inlet 2627*a* can be positioned above the second inlet 2625*a*.

A space between a bottom end of the guide wall 2621 and the first recollecting container 2623 functions as a first outlet 2623*b* through which a fume and an airflow generated from the liquid are discharged. A space between a bottom end of the first recollecting container 2623 and the second recollecting container 2625 functions as a second outlet 2625*b* through which the fume and the airflow generated from the liquid are discharged. A space between a bottom end of the second recollecting container 2625 and the third recollecting container 2627 functions as a third outlet 2627*b* through which the fume and the airflow generated from the liquid are discharged. The fume and the airflow discharged from the first outlet 2623*b*, the second outlet 2625*b*, and the third outlet 2627*b* are exhausted through an exhaust unit 2650 to be described later.

The support unit 2630 has a spin chuck 2631, a support pin 2633, a chuck pin 2635, a rotation shaft 2637, and a first driver 2639. The spin chuck 2631 has a top surface, which is generally a circular form when viewed from above. The top surface of the spin chuck 2631 may have a diameter larger than that of the substrate W.

The support pin 2633 may be provided in a plurality. The support pins 2633 are disposed at an edge portion of the top surface of the spin chuck 2631 to be spaced apart from each other at a predetermined interval with defining an annular ring, and upwardly protrude from the spin chuck 2631. The support pins 2633 support an edge of rear surface of the substrate W such that the substrate W is spaced apart from the top surface of the spin chuck 2631 by a predetermined distance.

The chuck pin 2635 may be provided in a plurality. The chuck pins 2635 are disposed to be farther from a center of the spin chuck 2631 than the support pin 2633. The chuck pins 2635 protrude from the top surface of the spin chuck 2631. The chuck pins 2635 support a side portion of the substrate W so that the substrate W does not laterally shift or sway when the substrate W is rotated. The chuck pins 2635 are movable between a standby position and a support position along a radial direction of the spin chuck 2631. The standby position is a position far from the center of the spin chuck 2631 compared to the support position. When the substrate W is loaded or unloaded on the support unit 2630, the chuck pin 2635 is positioned at the standby position, and when a process is performed on the substrate W, the chuck pin 2635 is positioned at the support position to support the substrate W and to block lateral shifting or swaying of the substrate W. At the support position, the chuck pins 2635 are in contact with the side of the substrate W.

The rotation shaft 2637 is coupled to the spin chuck 2631. The rotation shaft 2637 may be coupled to a bottom surface of the spin chuck 2631. The rotation shaft 2637 is provided to be rotatable by receiving a power from the first driver 2639. The first driver 2639 rotates the rotation shaft 2637, thereby rotating the spin chuck 2631. The first driver 2639 may vary a rotation speed of the rotation shaft 2637. The first driver 2639 may be a motor that provides a driving force. However, the inventive concept is not limited thereto, and may be variously modified as a known device that provides a driving force.

An exhaust line 2650 exhausts a fume and a gas generated at the treating space. The exhaust line 2650 exhausts the fume and the gas generated while the substrate W is being liquid-treated. The exhaust line 2650 may be coupled to a bottom surface of the treating container 2620. In an embodiment, the exhaust line 2650 may be positioned between the rotation shaft 2637 of the support unit 2630 and an inner wall of the treating container 2620. A depressurizing unit (not shown) is provided at the exhaust line 2650. The fume and the gas generated during a liquid treatment of the substrate W are exhausted from the treating space to an outside of the treating space by the depressurizing unit.

An airflow supply unit 2660 supplies an airflow to an inner space of the housing 2610. The airflow supply unit 2660 may supply a downward airflow to the inner space. The airflow supply unit 2660 may be installed at the housing 2610. The airflow supply unit 2660 may be installed above the treating container 2620 and the support unit 2630. A gas supplied to the inner space of the housing 2610 through the airflow supply unit 2660 forms a downward airflow in the inner space. The gas by-products generated by a treating process within the treating space are discharged to an outside of the housing 2610 through the exhaust line 2650 by the downward airflow. The airflow supply unit 2660 may be provided as a fan filter unit.

The liquid supply unit 3000 supplies a liquid onto the substrate W supported by the support unit 2630. A plurality of liquid supply units 3000 may be provided. Each of the plurality of liquid supply units 3000 may supply different types of liquid onto the substrate W. According to an embodiment, each of the liquid supply units 3000 may supply a first treating liquid and a second treating liquid, respectively. In an embodiment, the first treating liquid and the second treating liquid may be any one of a chemical, a rinsing liquid, and an organic solvent. For example, the chemical may include a diluted sulfuric acid peroxide ($H_2SO_4$), a phosphoric acid ($P_2O_5$), a hydrofluoric acid (HF), and an ammonium hydroxide ($NH_4OH$). For example, the rinsing liquid may include a water or a deionized water (DIW). For example, the organic solvent may include an alcohol such as an isopropyl alcohol (IPA). Hereinafter, a case in which the liquid supply unit 3000 supplies a phosphoric acid onto the substrate W will be described as an example. Hereinafter, the phosphoric acid supplied onto the substrate W is referred to as a treating liquid.

Figure 3:
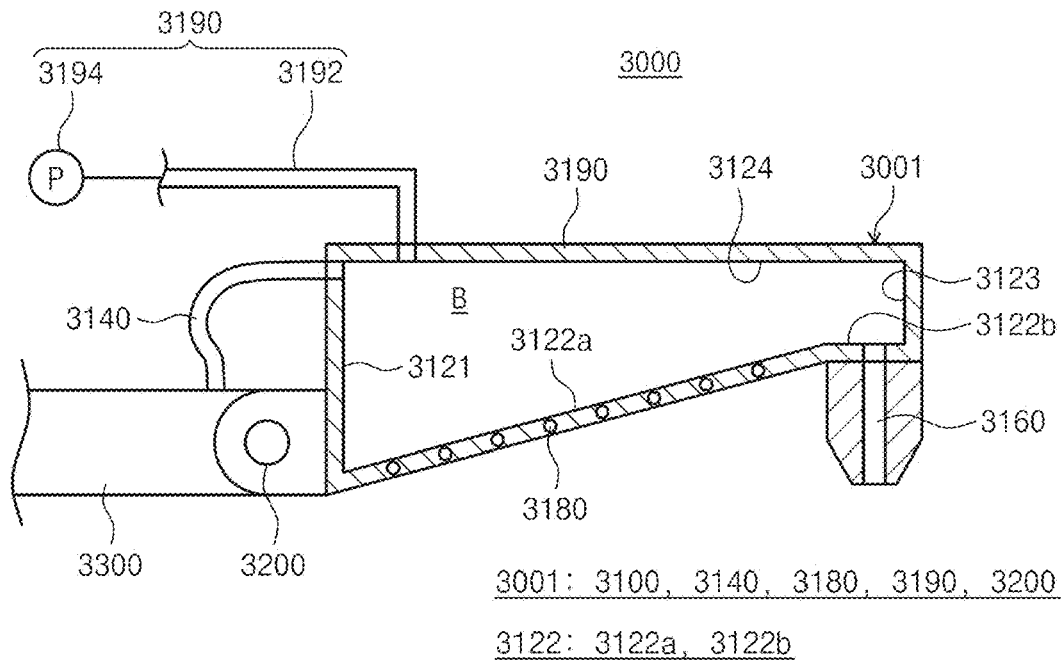
FIG. 3 schematically illustrates a nozzle member of FIG. 2.

FIG. 3 schematically illustrates a nozzle member of FIG. 2. Referring to FIG. 2 and FIG. 3, The liquid supply unit 3000 may include a nozzle member 3001, a driving member 3002, and a supply member (not shown). The nozzle member 3001 discharges a treating liquid onto the substrate W. The nozzle member 3001 discharges the treating liquid toward a top surface of a substrate W supported by the support unit 2630. The nozzle member 3001 may include a body 3100, a connection pipe 3140, a heating member 3180, an exhaust member 3190, and a rotation member 3200.

The body 3100 may have a buffer space B therein. The body 3100 may be made of a material having a heat resistance. In addition, the body 3100 may be made of a material having a stronger heat resistance than a filter 3900 to be described later. In an embodiment, the body 3100 may be made of a material including a quartz. A treating liquid supplied from a connection pipe 3140 to be described later may be stored at the buffer space B. The treating liquid stored at the buffer space B may be heated to a set temperature by a heating member 3180 to be described later. The buffer space B may include a first side surface 3121, a bottom surface 3122, a second side surface 3123, and a ceiling surface 3124.

The first side surface 3121 forming the buffer space B may be formed in a direction perpendicular to the ground. The connection pipe 3140 may be connected to the first side surface 3121. A sidewall of the body 3100 facing the first sidewall 3121 may be connected to a support arm 3300 to be described later.

The bottom surface 3122 forming the buffer space B may be in contact with the first side surface 3121. The bottom surface 3122 may be in contact with the second side surface 3123. The bottom surface 3122 may be formed to be generally inclined when viewed from the front. The bottom surface 3122 may include an inclined portion 3122a and a horizontal portion 3122b. An end of the inclined portion 312a may be in contact with the first side surface 3121. The other end of the inclined portion 3122a may be in contact with the horizontal portion 3122b. The inclined portion 3122a may be upwardly inclined with respect to the ground in a direction away from the first side surface 3121 when viewed from the front. The horizontal portion 3122b may be formed horizontally with respect to the ground. An end of the horizontal portion 3122b may be in contact with the inclined portion 3122a. The horizontal portion 3122b may extend from a top end of the inclined portion 3122a in a horizontal direction with respect to the ground. A discharge port 3160 to be described later may be formed at the horizontal part 3122b.

The second side surface 3123 forming the buffer space B may be formed in a direction perpendicular to the ground.

An end of the second side surface 3123 may be in contact with the discharge port 3160. The other end of the second side surface 3123 may be in contact with the ceiling surface 3124.

The ceiling surface 3124 forming the buffer space B may be formed in a direction horizontal to the ground. An end of the ceiling surface 3124 may be in contact with the second side surface 3123. The other end of the ceiling surface 3124 may be in contact with the first side surface 3121. An exhaust member 3190 to be described later may be connected to the ceiling surface 3124.

The connection pipe 3140 may be connected to the first side surface 3121 forming the buffer space B. The connection pipe 3140 may communicate with a supply member (not shown) to be described later through which a treating liquid flows. Accordingly, the connection pipe 3140 may supply the treating liquid to the buffer space B. The connection pipe 3140 may be provided as a pipe having an elasticity. In an embodiment, the connection pipe 3140 may be provided as a flexible pipe. Selectively, the connection pipe 3140 may be provided as a coil-tube. When the body 3100 is rotated by a rotation member 3200 to be described later, the connection pipe 3140 may be stretched or/and compressed according to a change in a position of the body 3100. In the embodiment of this invention described above, it is described as an example that the connection pipe 3140 is connected to the first side surface 3121, but the inventive concept is not limited to it. The connection pipe 3140 may be connected to various positions capable of supplying the treating liquid to the buffer space B.

The discharge port 3160 discharges the treating liquid filled in the buffer space B to the substrate W supported on the support unit 2630. The discharge port 3160 is formed under the body 3100. In an embodiment, the discharge port 3160 may be formed as an opening. For example, the discharge port 3160 may be formed as an opening penetrating a bottom portion of the body 3100. The discharge port 3160 may be formed penetrating the bottom portion of the body 3100 at the horizontal portion 3122*b* of the bottom surface 3122 to form the buffer space B. Unlike the above-described example, the discharge port 3160 may be formed as an opening penetrating the bottom portion of the body 3100, and a spray member communicating with the opening may be further provided. The treating liquid filled in the buffer space B may be discharged onto the substrate from the spray member communicating with the opening.

The heating member 3180 heats the treating liquid filled in the buffer space B. The heating member 3180 increases a temperature of the treating liquid filled in the buffer space B to a set temperature. The heating member 3180 heats the body 3100 so that the treating liquid provided in the buffer space B is heated. For example, if the treating liquid supplied to the buffer space B is a phosphoric acid, the heating member 3180 may heat the treating liquid to 200° C. or above. The heating member 3180 may be installed at the body 3100. In an embodiment, the heating member 3180 may be installed at a bottom wall of the body 3100 facing the bottom surface 3122 forming the buffer space B. For example, the heating member 3180 may be buried at the bottom wall of the body 3100 facing the inclined portion 3122*a*. The heating member 3180 may be provided as a heater. The heater may be provided as a heating resistor to which a current is applied. However, the inventive concept is not limited to this, and the heating member 3180 can be provided as a heater having a heating pattern to surround an outer surface of the body 3100. In an embodiment, the heating member 3180 may be installed at each of the outer surfaces of the body 3100 to heat the body 3100.

An exhaust member 3190 exhausts an atmosphere of the buffer space B. The exhaust member 3190 may exhaust a high-temperature steam generated in a process of heating the treating liquid filled in the buffer space B. The exhaust member 3190 may be installed above the body 3100. The exhaust member 3190 may include an exhaust pipe 3192 and a depressurizing pump 3194. The exhaust pipe 3192 provides a path through which the high-temperature steam flows. An end of the exhaust pipe 3192 may be connected to an top portion of the body 3100. An end of the exhaust pipe 3192 may be connected to the ceiling surface 3124 forming the buffer space B. The other end of the exhaust pipe 3192 may be connected to a top wall of the housing 2610. Accordingly, the high-temperature steam flowing through the exhaust pipe 3192 may be discharged to an outside of the housing 2610. However, the inventive concept is not limited to this, and the other end of the exhaust pipe 3192 may be connected to the exhaust line 2650 and may be exhausted together with the fume generated at the treating space. The depressurizing pump 3194 may provide a negative pressure to an inside of the exhaust pipe 3192. The depressurizing pump 3194 may be variously modified and provided as a known device providing the negative pressure.

A rotation member 3200 may change the position of the body 3100. The rotation member 3200 may change an inclination of the body 3100. The rotation member 3200 may rotate the body 3100. The rotation member 3200 may be installed at an end of a support arm 3300 to be described later. The rotation member 3200 may be connected to the body 3100. The rotation member 3200 may be connected to a sidewall of the body 3100. For example, the rotation member 3200 may be connected to a bottom end of the sidewall of the body 3100 facing the first side surface 3121. When viewed from the front, the rotation member 3200 may rotate the body 3100 with a virtual line penetrating the support arm 3300 as a center axis. The rotation member 3200 may be provided as a motor. The rotation member 3200 may be variously modified by a known motor providing a driving force.

In the embodiment of this invention described above, the rotation member 3200 is provided as a motor to rotate the body 3100, but the inventive concept is not limited to it. The rotation member 3200 may include a motor and a shaft. The motor may be installed on the bottom surface of the housing 2610. Both ends of the shaft may be coupled to an inner circumferential surface of a bearing. An end of the shaft may be connected to a motor, and the other end of the shaft may be connected to a bearing house connected to a sidewall of the body 3100. Accordingly, the rotation member 3200 may be rotated by driving the motor.

The rotation member 3200 may change the body 3100 between a first state and a second state by a rotation. The first state is a state in which the treating liquid filled in the buffer space B does not flow to the discharge port 3160. In the first state, the bottom surface 3122 forming the buffer space B may be provided to be inclined from the ground. In an embodiment, in the first state, the inclined portion 3122*a* may be provided to be inclined from the ground. In the second state, the treating liquid filled in the buffer space B is discharged to an outside of the body 3100 through the discharge port 3160. In the second state, the bottom surface 3122 forming the buffer space B may be provided more smoothly than an inclination of the bottom surface 3122 in the first state. In the second state, an inclination of the inclined portion 3122*a* may be provided more smoothly than the inclination of the inclined portion 3122a in the first state. Selectively, in the second state, the bottom surface 3122 may be provided parallel to the ground. In the second state, the inclined portion 3122a may be provided parallel to the ground.

The driving member 3002 may move the nozzle member 3001 to a process position and a standby position. The process position may be a position where the nozzle member 3001 faces the substrate W supported by the support unit 2630. The standby position may be a position at which the nozzle member 3001 is out of the process position. The driving member 3002 may include a support arm 3300, a support shaft 3400, and an arm driver 3500.

The support arm 3300 is coupled to a top end of the support shaft 3400. The support arm 3300 extends vertically from the support shaft 3400. A nozzle member 3001 may be coupled to the support arm 3300. For example, the rotation member 3200 may be connected to an end of the support arm 3300. The support arm 3300 may support the body 3100 via the rotation member 3200. The support arm 3300 may be provided to be able to move forwardly and backwardly in a lengthwise direction thereof. When viewed from the top, the nozzle member 3001 may be swing-moved to coincide with a central axis of the substrate W.

The support shaft 3400 is positioned on a side of the treating container 2620. The support shaft 3400 has a rod shape with its lengthwise direction facing the third direction 6. The support shaft 3400 is rotatable by the arm driver 3500. As the support shaft 3400 is rotated, the nozzle member 3001 may swing together with the support arm 3300. The nozzle member 3100 may be swing-moved to be moved between the process position and the standby position.

The supply member (not shown) may supply the treating liquid to the nozzle member 3001. The supply member (not shown) may be pipe. The supply member (not shown) may be connected to the connection pipe 3140. The supply member (not shown) may flow the treating liquid to the connection pipe 3140. The supply member (not shown) is located inside the support arm 3300.

Hereinafter, a substrate treating method according to an embodiment of the inventive concept will be described in detail. The substrate treating method described below may be performed by the process chamber 260 described above. Also, the controller 30 can control components of the process chamber 260 so that the process chamber 260 can perform the substrate treating method described below. For example, the controller 30 may generate a control signal for controlling a liquid supply unit 3000 so that components of the process chamber 260 may perform the substrate treating method described below.

Figure 4:
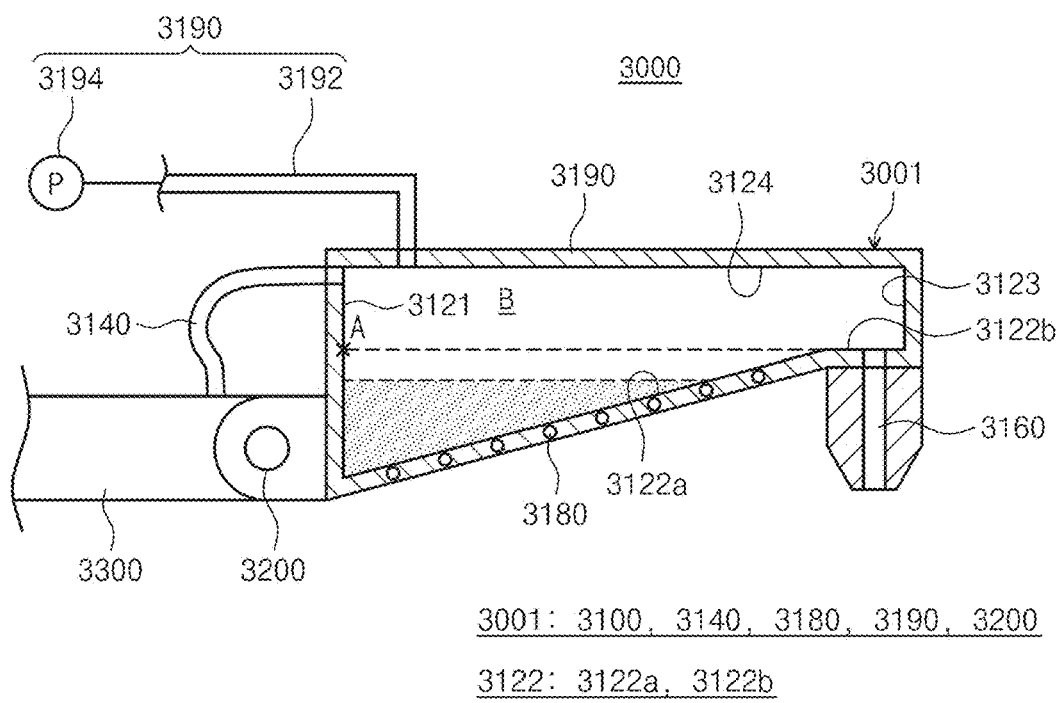
FIG. 4 schematically illustrates a state in which a treating liquid is supplied to a buffer space of FIG. 3.

FIG. 4 schematically illustrates a state in which a treating liquid is supplied to the buffer space of FIG. 3. Referring to FIG. 4, a nozzle member 3001 is positioned at a standby position before a substrate W is loaded on the support unit 2630. The standby position may be a position that does not face the support unit 2630 when viewed from above. When the nozzle member 3001 is in the standby position, the supply member (not shown) supplies the treating liquid into the buffer space B. If the nozzle member 3001 is in the standby position, The supply member (not shown) supplies the treating liquid into the buffer space B.

If the nozzle member 3001 is in the standby position, the body 3100 may be in a first state. The first state is a state in which the treating liquid filled in the buffer space B does not flow to the discharge port 3160. In the first state, a bottom surface 3122 forming the buffer space B may be provided to be inclined from the ground. For example, in the first state, an inclined portion 3122a may be provided to be inclined from the ground. Accordingly, even though the treating liquid is supplied to the buffer space B of the body 3100 in the first state, the treating liquid does not flow through the discharge port 3160 due to an inclination formed by the inclined portion 3122a.

The treating liquid supplied to the buffer space B may be supplied to a point A, which is a limit level at which the treating liquid does not flow through the discharge port 3160. An amount of the treating liquid supplied to point A may correspond to a single discharge amount on the substrate W when the substrate W is later loaded on the support unit 2630.

Figure 5:
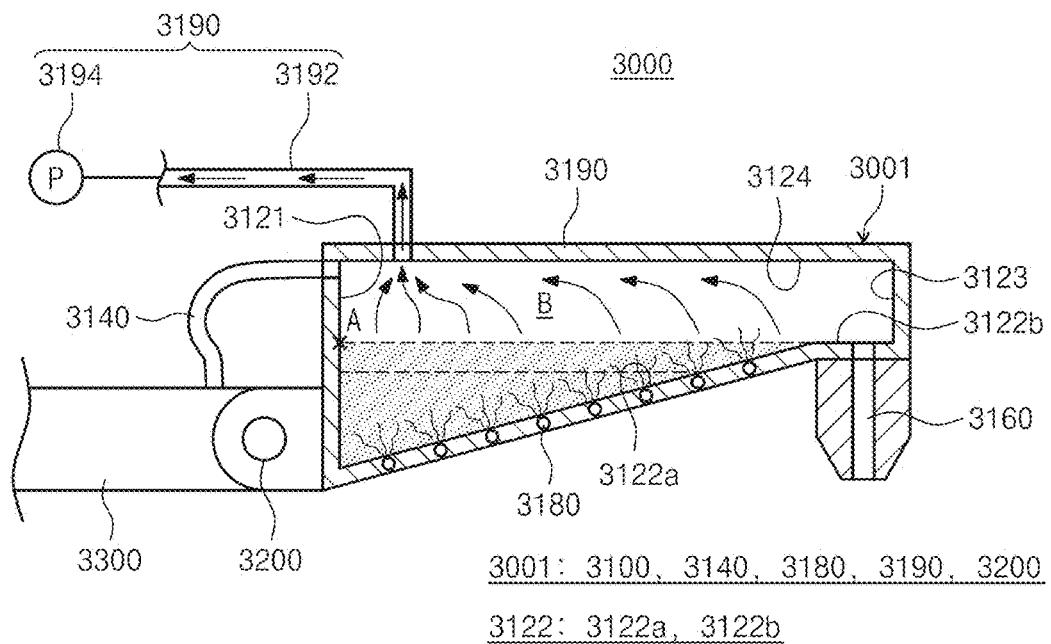
FIG. 5 schematically illustrates a state in which the treating liquid is heated in the buffer space of FIG. 3.

FIG. 5 schematically illustrates a state in which a treating liquid is heated at a buffer space of FIG. 3. Referring to FIG. 5, the treating liquid supplied to the buffer space B is heated to a set temperature. The treating liquid supplied to the buffer space B is heated up to a set temperature by the heating member 3180. A nozzle member 3001 is positioned at a standby position until the treating liquid supplied to the buffer space B is heated to a set temperature. For example, if the treating liquid supplied to the buffer space B is a phosphoric acid, the heating member 3180 may heat the body 3100 until the temperature of the phosphoric acid reaches 200° C. or above. A high-temperature vapor generated in a process of heating the treating liquid in the buffer space B is discharged through the exhaust member 319 connected to the top part of the body 3100. Accordingly, a damage to the nozzle member 3001 due to a high-temperature vapor pressure during the heating process may be prevented.

Figure 6:
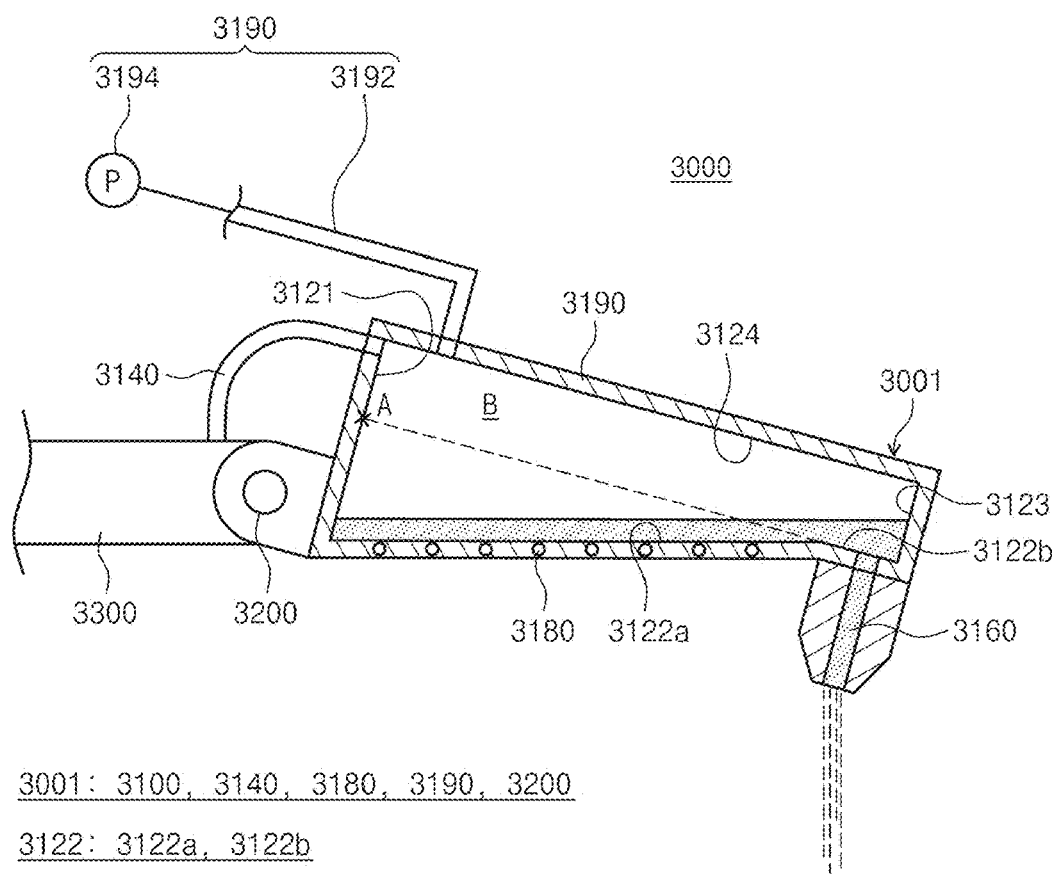
FIG. 6 schematically illustrates a state in which the treating liquid is discharged onto a substrate from the buffer space of FIG. 3.

FIG. 6 schematically illustrates a state in which a treating liquid is discharged onto a substrate at the buffer space of FIG. 3. Referring to FIG. 6, the substrate W is loaded on a support unit 2830, and a nozzle member 3001 moves from a standby position to a process position. If the substrate W is loaded on the support unit 2830, the nozzle member 3001 is rotated by the driving member 3002 to move to a process position facing the substrate W supported on the support unit 2630. Before the nozzle member 3001 moves from the standby position to the process position, the treating liquid filled in the buffer space B may be heated to a set temperature. However, the inventive concept is not limited thereto, and the treating liquid filled in the buffer space B may be heated to a set temperature before the treating liquid is discharged onto the substrate W after the nozzle member 3001 is moved to the process position.

The nozzle member 3001 moved to the process position stops at the process position facing the substrate W. If the nozzle member 3001 stops, the body 3100 is changed to a second state by a rotation of the rotation member 3200. In the second state, the treating liquid filled in the buffer space B is discharged to an outside of the body 3100 through the discharge port 3160. In the second state, a bottom surface 3122 forming the buffer space B may be provided more smoothly than an inclination of the bottom surface 3122 in the first state. In the second state, an inclination of the inclined portion 3122a may be provided more smoothly than the inclination of the inclined portion 3122a in the first state. Selectively, in the second state, the bottom surface 3122 may be provided parallel to the ground. In the second state, the inclined portion 3122a may be provided parallel to the ground. Accordingly, the treating liquid heated to the set temperature may be discharged from a buffer space B with a strong heat resistance onto a substrate W rotating on the support unit 2630.

In accordance with the above-described embodiment of the inventive concept, by heating the treating liquid in the buffer space B with the strong heat resistance, a damage to components with a weak heat resistance provided to a liquid supply apparatus may be minimized. In addition, since a high-temperature vapor pressure generated in a process of heating the treating liquid in the buffer space B can be efficiently exhausted, a damage to a component due to the high-temperature vapor pressure can be minimized. In addition, the substrate W may be efficiently treated by directly discharging the treating liquid heated to a set temperature from the buffer space B onto the substrate W.

The liquid supply unit according to another embodiment described below is similarly provided except for the liquid supply unit and the rotation member according to the above-described embodiment. Accordingly, a description of overlapping configurations will be omitted hereinafter.

Figure 7:
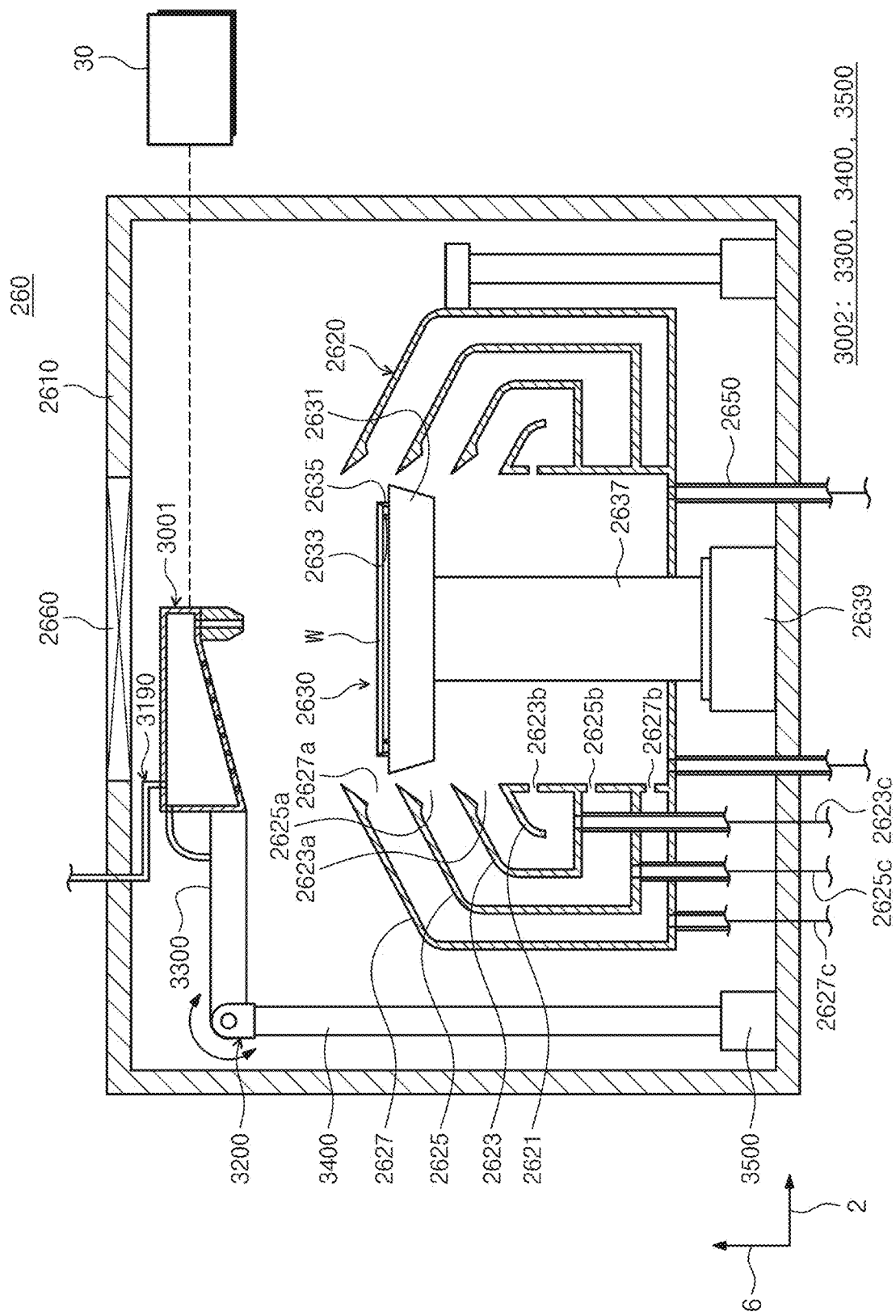
FIG. 7 schematically illustrates another embodiment of a liquid supply unit of FIG. 2.

FIG. 7 is a view schematically illustrating another embodiment of a liquid supply unit of FIG. 2. Referring to FIG. 7, a rotation member 3200 may be installed on a top end of a support shaft 3400. The rotation member 3200 may be installed at the top end of the support shaft 3400 to provide a rotational force to a support arm 3300. The rotation member 3200 may be provided as a known motor that provides the rotational force. The rotation member 3200 may rotate the support arm 3300 in an up/down direction. A nozzle member 3001 may be fixedly installed at an end of the support arm 3300. The rotation member 3200 rotates the support arm 3300, and the nozzle member 3001 fixedly installed on the support arm 3300 may rotate in the up/down direction by a rotation of the support arm 3300. Accordingly, a position of the body 3100 may be changed between a first state and a second state.

Figure 8:
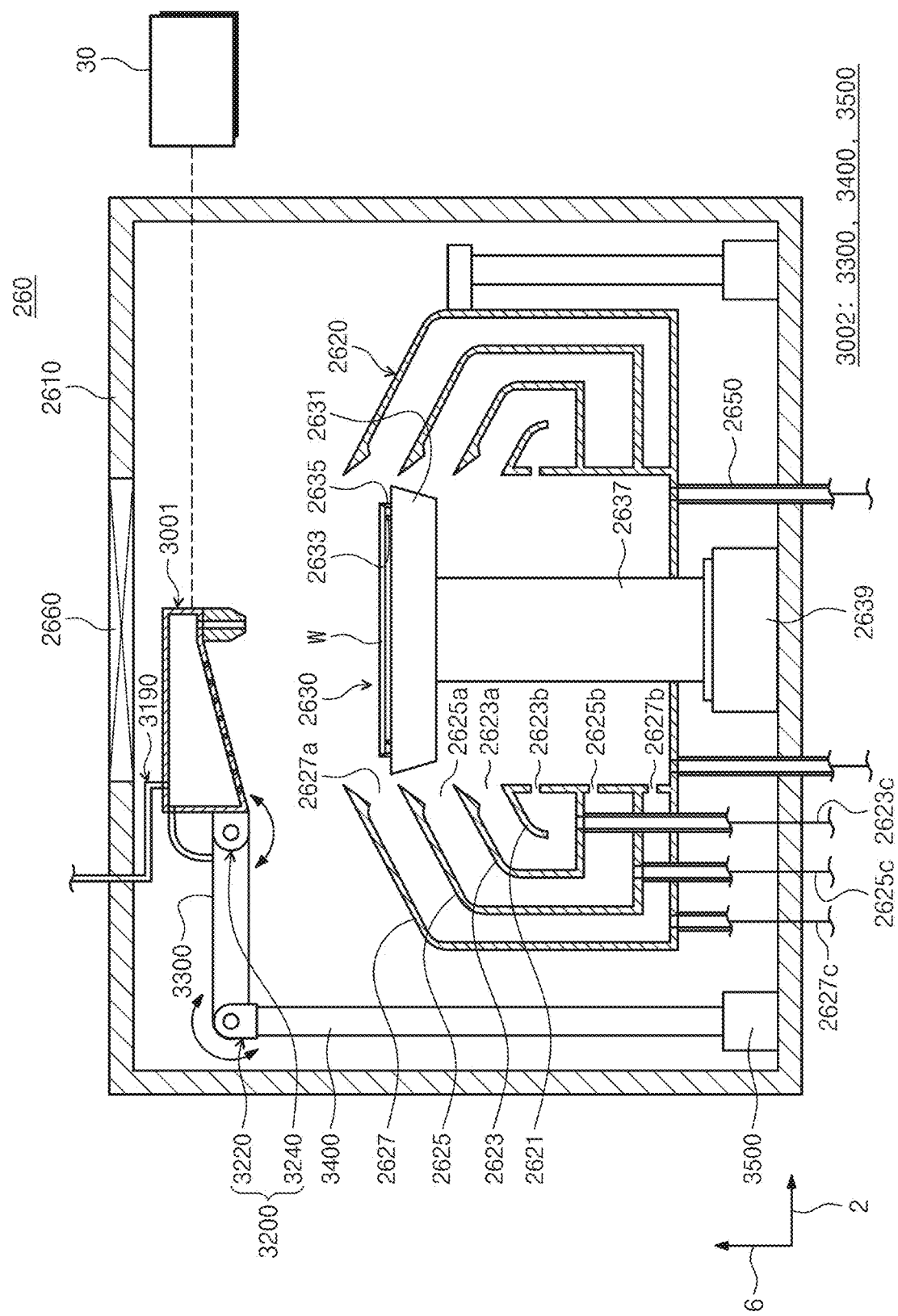
FIG. 8 schematically illustrates another embodiment of the liquid supply unit of FIG. 2.

FIG. 8 is a view schematically illustrating another embodiment of the liquid supply unit of FIG. 2. Referring to FIG. 8, a rotation member 3200 may include a first rotation member 3220 and a second rotation member 3240. The first rotation member 3220 may be installed on a top end of the support shaft 3400. The first rotation member 3220 may be installed at the top end of the support shaft 3400 to provide a rotational force to the support arm 3300. The first rotation member 3220 may be provided as a known motor that provides a rotational force. The first rotation member 3220 may rotate a support arm 3300 in a first direction from a bottom toward a top.

The second rotation member 3240 may be installed at an end of the support arm 2642. The second rotation member 3240 may be connected to the body 3100. The second rotation member 3240 may be connected to a sidewall of the body 3100. For example, the second rotation member 3240 may be connected to a bottom end of the sidewall of the body 3100 facing a first side surface 3121. When viewed from the front, the second rotation member 3240 may rotate the body 3100 with a virtual line penetrating the support arm 3300 as a center axis. The rotation member 3200 may be provided as a motor. The rotation member 3200 may be variously modified by a known motor providing a driving force. The second rotation member 3240 may rotate the body 3100 in a second direction from the top toward the bottom.

If the treating liquid filled in the buffer space B is discharged to the substrate W, the second rotation member 3240 may rotate the body 3100 in the second direction to discharge a treating liquid which is heated to the substrate W through the discharge port 3160. If the second rotation member 3240 rotates in the second direction, the first rotation member 3220 may rotate in the first direction to correct a position at which the treating liquid is discharged on the substrate W so that the treating liquid accurately impacts a preset discharge point on the substrate W.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate treating apparatus comprising:
a treating container having a treating space;
a support configured to support a substrate at the treating space; and
a liquid supply configured to supply a treating liquid to the substrate supported by the support, and
wherein the liquid supply comprises:
a nozzle member configured to discharge the treating liquid; and
a driving member configured to move the nozzle member to a standby position and a process position, and
wherein the nozzle member comprises:
a body having a buffer space therein and a discharge port configured to discharge the treating liquid; and
a rotation member configured to change the body between a first state and a second state by a rotation, and
wherein the first state is a state at which the treating liquid filled in the buffer space is maintained so the treating liquid does not flow to the discharge port, and
the second state is a state at which the treating liquid filled in the buffer space is discharged to an outside of the body through the discharge port.

2. The substrate treating apparatus of claim 1, wherein a bottom surface of the buffer space includes an inclined portion which is downwardly inclined toward a ground in a direction away from the discharge port.

3. The substrate treating apparatus of claim 2, wherein the bottom surface of the buffer space further comprises a horizontal portion which extends in a horizontal direction with respect to the ground from a top end of the inclined portion.

4. The substrate treating apparatus of claim 2 further comprising a controller configured to control the liquid supply, and
wherein the controller is configured to control the rotation member to rotate the body so an inclination of the body changes between the first state and the second state.

5. The substrate treating apparatus of claim 4, wherein the bottom surface of the buffer space is provided inclined from the ground in the first state.

6. The substrate treating apparatus of claim 5, wherein the bottom surface of the buffer space is provided less inclined than an inclination of the first state or parallel to the ground in the second state.

7. The substrate treating apparatus of claim 6, wherein the treating liquid filled in the buffer space is provided as a single discharge amount onto the substrate supported by the support-wait.

8. The substrate treating apparatus of claim 1, wherein the nozzle member further comprises:
   a heating member configured to heat the treating liquid filled in the buffer space; and
   an exhaust member configured to exhaust an atmosphere of the buffer space.

9. The substrate treating apparatus of claim 1, wherein the liquid supply comprises:
   a supply pipe configured to supply the treating liquid to the buffer space; and
   a supply valve configured to open and close the supply pipe.

10. The substrate treating apparatus of claim 9, wherein the body is provided in a material having a stronger heat resistance than the supply valve.

11. A liquid supply unit for supplying a treating liquid onto a substrate comprising:
   a nozzle member configured to discharge the treating liquid; and
   a driving member configured to move the nozzle member to a standby position and a process position, and
   wherein the nozzle member comprises:
      a body having a buffer space therein and a discharge port configured to discharge the treating liquid; and
      a rotation member configured to change the body between a first state and a second state by a rotation, and
   wherein the first state is a state at which the treating liquid filled in the buffer space is maintained so the treating liquid does not flow from the discharge port, and the second state is a state at which the treating liquid filled in the buffer space is discharged to an outside of the body though the discharge port.

12. The liquid supply of claim 11, wherein a bottom surface of the buffer space comprises:
   an inclined portion which is downwardly inclined toward a ground in a direction away from the discharge port; and
   a horizontal portion which extends in a horizontal direction with respect to the ground from a top end of the inclined portion, and
   wherein the discharge port is provided at the horizontal portion.

13. The liquid supply of claim 12, wherein the bottom surface of the buffer space is provided inclined toward the ground in the first state, and the bottom surface of the buffer space is provided less inclined than an inclination of the first state or parallel to the ground in the second state.

14. The liquid supply unit of claim 11, wherein the nozzle member further comprises:
   a heating member configured to heat the treating liquid filled in the buffer space; and
   an exhaust member configured to exhaust an atmosphere of the buffer space.

15. The liquid supply unit of claim 11, wherein the liquid supply further comprises:
   a supply pipe configured to supply the treating liquid to the buffer space; and
   a supply valve configured to open and close the supply pipe.

16. The liquid supply of claim 15, wherein the body is provided in a material having a stronger heat resistance than the supply valve.

* * * * *